United States Patent
North et al.

(10) Patent No.: US 11,147,186 B2
(45) Date of Patent: Oct. 12, 2021

(54) PREDICTIVE FAN CONTROL USING WORKLOAD PROFILES

(71) Applicant: Dell Products, L.P., Round Rock, TX (US)

(72) Inventors: Travis C. North, Cedar Park, TX (US); Mitchell Anthony Markow, Hutto, TX (US); Richard C. Thompson, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 64 days.

(21) Appl. No.: 16/558,988

(22) Filed: Sep. 3, 2019

(65) Prior Publication Data

US 2021/0068302 A1 Mar. 4, 2021

(51) Int. Cl.
*H05K 7/20* (2006.01)
*G06F 9/50* (2006.01)
*G06F 1/20* (2006.01)

(52) U.S. Cl.
CPC ......... *H05K 7/20209* (2013.01); *G06F 1/206* (2013.01); *G06F 9/5055* (2013.01); *G06F 2209/5019* (2013.01)

(58) Field of Classification Search
CPC .... H05K 7/20209; G06F 1/206; G06F 9/5055
See application file for complete search history.

(56) References Cited

U.S. PATENT DOCUMENTS

| | | | | |
|---|---|---|---|---|
| 6,591,198 B1 * | 7/2003 | Pratt | ...................... | G06F 1/206 369/44.32 |
| 7,941,231 B1 * | 5/2011 | Dunn | ...................... | G06F 1/203 700/17 |
| 10,888,022 B2 * | 1/2021 | Chen | .................. | G05D 23/1919 |
| 2016/0011607 A1 * | 1/2016 | James | ...................... | H05K 7/20 700/300 |
| 2016/0013745 A1 * | 1/2016 | North | ..................... | G06F 1/1684 318/460 |
| 2017/0220022 A1 * | 8/2017 | Hankendi | .................. | G06F 1/20 |
| 2018/0299940 A1 * | 10/2018 | Wang | ...................... | G06F 15/76 |
| 2018/0310434 A1 * | 10/2018 | Young | .................. | G10K 11/004 |

* cited by examiner

*Primary Examiner* — Mohammad Ali
*Assistant Examiner* — Vincent W Chang
(74) *Attorney, Agent, or Firm* — Fogarty LLP

(57) ABSTRACT

Airflow cooling is provided in an IHS (Information Handling System), where the airflow cooling may be adapted to reduce noise generated by the airflow cooling system and to provide cooling that is particularized to specific users. The operation of a software application by a user is detected. A workload profile associated with that application is determined and used to provide airflow cooling. The workload profile specifies parameters for providing cooling during use of applications associated with a first type of resource utilization. Upon detecting use of a different application, a different workload profile associated with applications of a second type of resource utilization may be determined and used to provide cooling. The user may provide noise feedback inputs specifying noise level preferences that are used in adapting the cooling provided by workload profiles. The workload profiles may be further adapted to reduce noise generated by the cooling system while still providing adequate cooling.

18 Claims, 5 Drawing Sheets

PREDICTIVE FAN CONTROL USING WORKLOAD PROFILES

FIELD

This disclosure relates generally to cooling internal components of an Information Handling System (IHS), and more specifically, to airflow cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to circulate heated air away from internal components, an IHS may utilize a cooling fan, or a plurality of cooling fans organized within an airflow cooling system, in order to ventilate heated air from inside the IHS. As temperatures within the IHS increase, the speed of cooling fans may be increased to ventilate additional heated air from within the IHS, or from within certain internal compartments of the IHS. Certain IHSs may utilize a single cooling fan to ventilate heated air from within the IHS. Other IHSs may utilize airflow cooling systems that include one or more banks of cooling fans and a fan controller that is configured to monitor and control the cooling fans.

Providing additional cooling may be accomplished by increasing the airflow velocity of the cooling fans, thus resulting in increased energy consumption and noise by the cooling system. For some IHSs that function as personal computing devices, such as laptop computers, users prefer that cooling fan noise remain at levels that are not perceived to be distracting. However, many cooling systems are configured to provide airflow outputs that provide cooling for worst-case cooling scenarios, thus resulting in substantial unnecessary operation of cooling fans and/or operation of cooling fans at unnecessarily high speeds. Such excess cooling operations tend to result in airflow cooling systems relying on the highest fan outputs that generate the most noticeable levels of noise.

SUMMARY

In various embodiments, a method provides airflow cooling in an IHS (Information Handling System). The method includes: generating a default airflow cooling output; detecting operation of a first software application by a first user of the IHS; determining a first workload profile associated with the first software application, wherein the first workload profile comprises a first cooling profile specifying parameters for providing cooling during use of software applications associated with a first type of resource utilization; generating a first airflow cooling output based on the first cooling profile; detecting operation of a second software application by the first user of the IHS; determining a second workload profile associated with the second software application, wherein the second workload profile comprises a second cooling profile specifying parameters for providing cooling during use of software applications associated with a second type of resource utilization; and generating a second airflow cooling output based on the second cooling profile.

In additional method embodiments, the first cooling profile and the second cooling profile comprise fan speed settings. In additional method embodiments, the first cooling profile and the second cooling profile further comprise a fan speed ramp rate setting. In additional method embodiments, a fan speed setting is selected from the first cooling profile based on measured temperatures within the IHS and wherein the first cooling profile further comprises a function for smoothing the measured temperatures. In additional embodiments, methods further include determining whether a temperature measured within the IHS is below a threshold temperature; and when the measured temperature is below the threshold temperature, reducing the airflow cooling output. In additional embodiments, methods further include monitoring a plurality of temperatures within the IHS during use of the reduced airflow cooling output; and determining whether the reduced airflow cooling output provides sufficient cooling based on the monitored temperatures. In additional embodiments, methods further include, when the reduced airflow provides sufficient cooling, modifying a plurality of the parameters of the second cooling profile to generate the reduced airflow during operation of additional software applications associated with the second workload profile. In additional embodiments, methods further include receiving an input from the first user during use of the second software application, wherein the input specifies a noise preference. In additional method embodiments, the noise preference specifies a limit on the noise generated in providing airflow cooling during use of the second software application. In additional embodiments, methods further include limiting a processing load by the second software application in response to the noise preference input, wherein the limited processing load results in reduced cooling requirements during operation of the second software application, and wherein the reduced cooling requirements are provided without exceeding the noise limit specified by the user input.

In various additional embodiments, an IHS includes: a plurality of processors; a plurality of cooling fans; an airflow controller comprising a memory device having instructions stored thereon that, upon execution by a logic unit, cause the airflow controller to: operate the plurality of cooling fans in generating a default airflow cooling output; receive an indication of a first user of the IHS operating a first software application; determine a first workload profile associated with the first software application, wherein the first workload profile comprises a cooling profile specifying parameters for providing cooling during use of software applications associated with a first type of resource utilization; operate the plurality of cooling fans in generating a first airflow cooling output based on the first cooling profile; receive an indication of the first user of the IHS operating a second software application; determine a second workload profile associated with the second software application, wherein the second workload profile comprises a second cooling profile specifying parameters for providing cooling during use of software applications associated with a second type of resource utilization; and operate the plurality of cooling fans in generating a second airflow cooling output based on the second cooling profile.

In additional IHS embodiments, the memory device of the airflow controller stores additional instructions that, upon execution by the logic unit, further cause the airflow controller to: determine whether a temperature of the one or more processors is below a threshold temperature; when the measured processor temperature is below the threshold temperature, reduce the airflow cooling output; monitor the temperature of the one or more processors during use of the reduced airflow cooling output; and determine whether the reduced airflow cooling output provides sufficient cooling based on the monitored temperatures and the threshold temperature. In additional IHS embodiments, the memory device of the airflow controller stores additional instructions that, upon execution by the logic unit, further cause the airflow controller to: modify, when the reduced airflow provides sufficient cooling, a plurality of the parameters of the second cooling profile to generate the reduced airflow during operation of additional software applications associated with the second workload profile. In additional IHS embodiments, the memory device of the airflow controller stores additional instructions that, upon execution by the logic unit, further cause the airflow controller to: receive an input from the first user during use of the second software application, wherein the input specifies a noise preference, wherein the noise preference specifies a limit on the noise generated in providing cooling during use of the second software application. In additional IHS embodiments, wherein the memory device of the airflow controller stores additional instructions that, upon execution by the logic unit, further cause the airflow controller to: limit a processing load on the one or more processors by the second software application, wherein the limited processing load results in reduced cooling requirements during operation of the second software application, and wherein the reduced cooling requirements can be provided without exceeding the noise limit specified by the user input.

In various additional embodiments, a computer-readable storage device having instructions stored thereon for providing airflow cooling in an IHS via a plurality of cooling fans, wherein execution of the instructions by the one or more processors, cause the one or more processors to: operate the plurality of cooling fans in generating a default airflow cooling output; receive an indication of a first user of the IHS operating a first software application; determine a first workload profile associated with the first software application, wherein the first workload profile comprises a cooling profile specifying parameters for providing cooling during use of software applications associated with a first type of resource utilization; operate the plurality of cooling fans in generating a first airflow cooling output based on the first cooling profile; receive an indication of the first user of the IHS operating a second software application; determine a second workload profile associated with the second software application, wherein the second workload profile comprises a second cooling profile specifying parameters for providing cooling during use of software applications associated with a second type of resource utilization; and operate the plurality of cooling fans in generating a second airflow cooling output based on the second cooling profile.

In additional storage device embodiments, the instructions further cause the one or more processors to: determine whether a temperature of the one or more processors is below a threshold temperature; when the measured processor temperature is below the threshold temperature, reduce the airflow cooling output; monitor the temperature the one or more processors during use of the reduced airflow cooling output; and determine whether the reduced airflow cooling output provides sufficient cooling based on the monitored temperatures and the threshold temperature. In additional storage device embodiments, the instructions further cause the one or more processors to: modify, when the reduced airflow provides sufficient cooling, a plurality of the parameters of the second cooling profile to generate the reduced airflow during operation of additional software applications associated with the second workload profile. In additional storage device embodiments, the instructions further cause the one or more processors to: receive an input from the first user during use of the second software application, wherein the input specifies a noise preference, wherein the noise preference specifies a limit on the noise generated in providing cooling during use of the second software application. In additional storage device embodiments, the instructions further cause the one or more processors to: limit a processing load on the one or more processors by the second software application, wherein the limited processing load results in reduced cooling requirements during operation of the second software application, and wherein the reduced cooling requirements can be provided without exceeding the noise limit specified by the user input.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
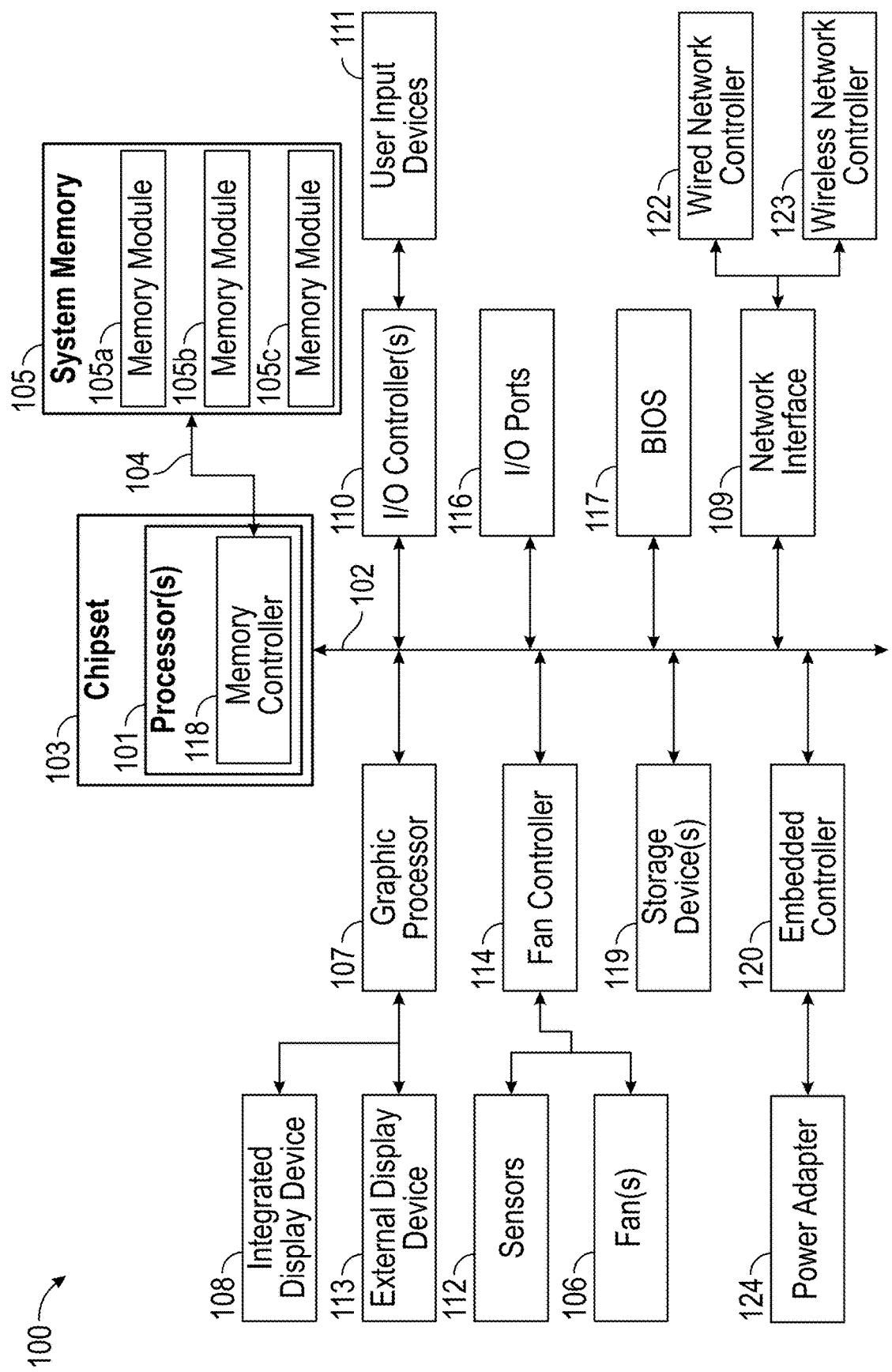
FIG. 1 is a block diagram depicting certain components of an IHS configured according to various embodiments for predictive fan control based on the selection of workload profiles that are used to provide airflow cooling to the IHS.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. FIG. 1 shows an example of an IHS configured to implement the systems and methods described herein. It should be appreciated that although certain IHS embodiments described herein may be discussed in the context of a personal computing device, other embodiments may be utilized.

FIG. 1 is a block diagram illustrating certain components of an IHS 100 configured according to certain embodiments for predictive fan control based on the selection of workload profiles that are used to provide airflow cooling to the IHS 100 through the operation of one or more cooling fans 106. As described in additional detail below, IHS 100 may include a fan controller 114 and/or an embedded controller 120 that may execute program instructions that perform certain of the operations disclosed herein for predictive fan control and adaptation of airflow outputs in response to user noise preference inputs and in further attempts to reduce the noise output generated by the cooling system.

IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104. The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of separate buses to provide the illustrated pathways served by bus 102.

In various embodiments, IHS 100 may include one or more I/O ports 116 that may support removeable couplings with various types of external devices and systems, including removeable couplings with peripheral devices that may be configured for operation by a particular user of IHS 100. For instance, I/O 116 ports may include USB (Universal Serial Bus) ports, by which a variety of external devices may be coupled to IHS 100. In addition to or instead of USB ports, I/O ports 116 may include various types of physical I/O ports that are accessible to a user via the enclosure of the IHS 100. As described in additional detail below, in various embodiments, configurable aspects of peripheral devices that are coupled to IHS 100 via I/O ports 116 may be managed based on the context of the user's operation of IHS 100 and any similarly configured IHSs.

In certain embodiments, chipset 103 may additionally utilize one or more I/O controllers 110 that may each support the operation of hardware components such as user I/O devices 111 that may include peripheral components that are physically coupled to an I/O port 116 and/or peripheral components that are wirelessly coupled to IHS 100 via a network interface 109. In various embodiments, I/O controller 110 may support the operation of one or more user I/O devices 110 such as a keyboard, mouse, touchpad, touchscreen, microphone, speakers, camera and other input and output devices that may be coupled to IHS 100. As described, user I/O devices 111 may interface with an I/O controller 110 through wired or wireless couplings supported by IHS 100.

As described, IHS 100 may support one or more of network interfaces 109 that may support different types of network connectivity. In certain embodiments, IHS 100 may include one or more Network Interface Controllers (NICs) 122, 123, each of which may implement the hardware required for communicating via a specific networking technology, such as W-Fi, BLUETOOTH, Ethernet and mobile cellular networks (e.g., CDMA, TDMA, LTE). As illustrated, network interface 109 may support network connections by wired network controllers 122 and wireless network controllers 123. Each network controller 122, 123 may be coupled via various buses to the chipset 103 of IHS 100 in supporting different types of network connectivity, such as the network connectivity utilized by the operating system of IHS 100. In certain embodiments, such network connectivity may support configuration of IHS 100 as a member of an enterprise network by which a variety of computing services may be provided to a user of IHS 100.

Chipset 103 may also provide access to one or more display device(s) 108, 113 via graphics processor 107. In certain embodiments, graphics processor 107 may be comprised within a video card, graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. In some embodiments, power to graphics processor 107, integrated display device 108 and/or external display 133 may be turned off, or configured to operate at minimal power levels, in response to IHS 100 entering a low-power state.

Chipset 103 also provides processor 101 with access to one or more storage devices 119. In various embodiments, a storage device 119 may be integral to the IHS 100 or may be external to the IHS 100. In certain embodiments, storage device 119 may be accessed via a storage controller that may be an integrated component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud system or enterprise data management system that is accessible via network interface 109.

As illustrated, IHS 100 also includes a BIOS (Basic Input/Output System) 117 that may be stored in a non-volatile memory accessible by chipset 103 via bus 102. The BIOS 117 provides an abstraction layer that allows the operating system to interface with the hardware components of the IHS 100. Upon powering or restarting IHS 100, processor(s) 101 may utilize BIOS 117 instructions to initialize and test hardware components coupled to the IHS 100, including both components permanently installed as components of the motherboard of IHS 100 and removable components installed within the various expansion slots supported by the IHS 100. The BIOS 117 instructions may also load an operating system for use by the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. In certain embodiments, the BIOS may be replaced, in full or in part, by a baseboard management controller (BMC) or another in-band or out-of-band controller that supports remote administration of IHS 100. In certain embodiments, the initialization of IHS 100 by BIOS 117 may be paused to allow for the validation of instructions utilized by a trusted component, such as by a secure processor, in order to establish a hardware root of trust in the trusted component that may then be utilized to support certain secure operations of IHS 100.

In the illustrated embodiment, IHS 100 includes a fan controller 114 that may be used to operate an airflow cooling system that may include one or more cooling fans 106. In certain embodiments, fan controller 114 may be include a processor or other logic unit and a memory for storage of firmware instructions used in the operation of the fan controller 114 as described herein. In other embodiments, fan controller 114 may be implemented as a system-on-chip function of a processor 101 of IHS 100, or may be implemented by another controller, such as embedded controller 120. The fan controller 114 may be configured to interoperate with one or more environmental sensors 112 in order to monitor temperature conditions at internal locations within the IHS 100, such as a core temperature collected by a sensor located in close proximity to processor 101. Based on temperature measurements collected by sensors 112, the fan controller 114 may activate or increase the speed of cooling fans in order to ventilate heated air from within the IHS 100. In some embodiments, fan controller 114 may be configured to generate signals that are used to control the operation of cooling fans 106.

In certain embodiments, the fan controller 114 or other component generating signals for controlling the operation of cooling fans 106 may utilize cooling profiles that specify a set of fan output parameters. For instance, in some embodiments, a cooling profile may be associated with a fan speed table that specifies a series of discrete fan speeds, where each of the specified fan speeds is associated with a metric, such as a temperature or power consumption. For instance, fan controller 114 may utilize a fan speed table to determine a speed for fans 106 that will provide sufficient airflow for a processor 101 operating at a specific core temperature.

Figure 5A:
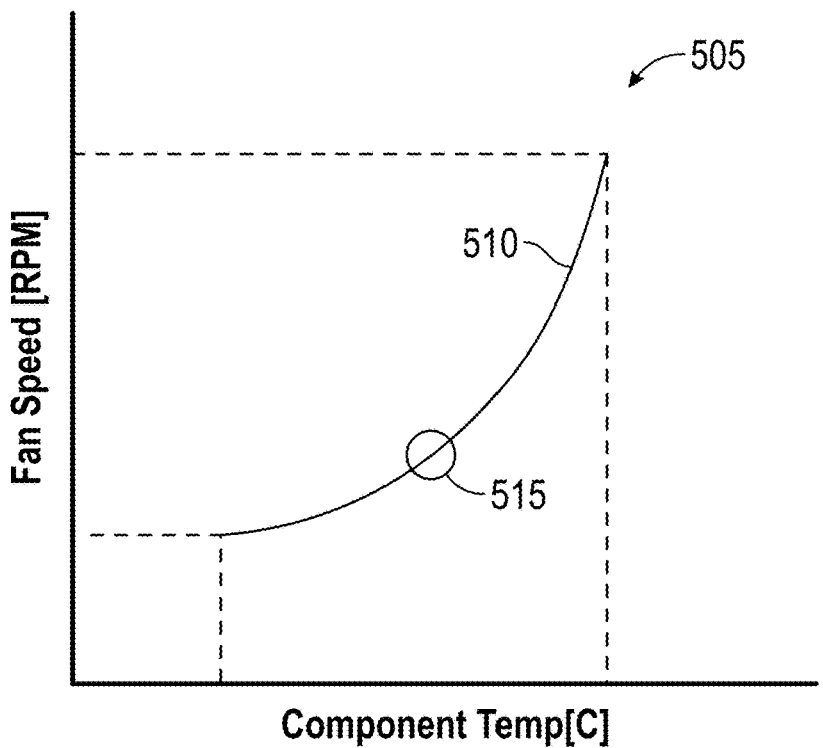
FIG. 5A is an illustration depicting a fan control curve for generating airflow outputs used to provide cooling in an IHS.
Figure 5B:
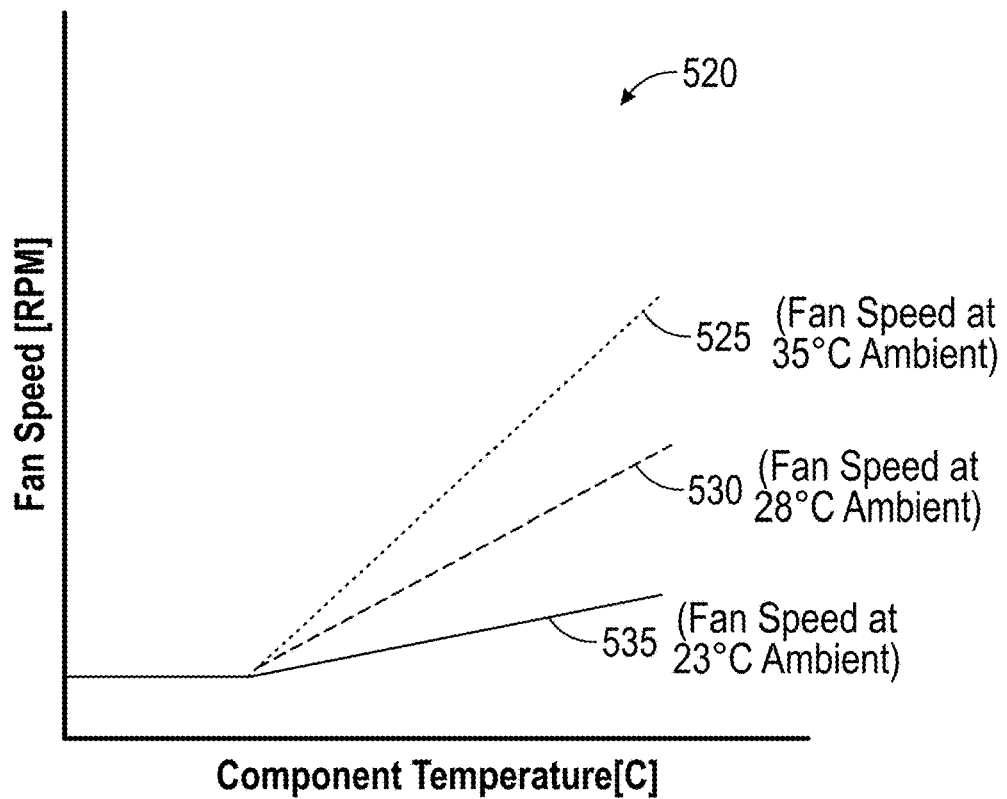
FIG. 5B is an illustration depicting additional fan control curves for generating airflow outputs used to provide cooling in an IHS.

In some embodiments, a cooling profile may specify a fan curve instead of or in addition to a fan speed table. Instead of the discrete set of fan speed outputs specified by a fan speed table, a fan curve may be a function, such as a linear functions or polynomial function, that defines a fan speed output based on one or more inputs such as temperature and/or power consumption. As illustrated in FIG. 5A, a fan curve may be used to generate a fan speed based on a monitored core temperature. As illustrated in FIG. 5B, multiple fan curves may be defined for operation of a cooling fan, which each of these multiple fan curves generates fan speed outputs for a range of ambient temperatures. A cooling profile may include a set of such fan curves that may be used by a fan controller 114 to configure the output of one or more cooling fans 106 based on the ambient temperature context in which the cooling system is operating.

In some embodiments, a cooling profile utilized by fan controller 114 may specify additional parameters, besides fan speeds, for the operation of the cooling fans 106. For instance, a cooling profile may also specify a ramp rate for use in the operation of a cooling fan 106. The ramp rate setting for a cooling fan may limit the rate of change in the speed of a cooling fan. The use of a high ramp rate supports faster increases in airflow output in response to rapid increases in temperature. A high ramp rate supports cooling responses to quickly changing temperatures. But, use of a high ramp rate may result in noticeable noise as the cooling fans quickly reach higher fan speeds that generate the most noise. Ramp rates that are defined based on worst-case cooling scenarios may be especially prone to operation of cooling fans at unnecessarily high speeds that generate noticeable levels of noise.

Another parameter that may be used in a cooling profile is temperature smoothing function that is used to reduce the effects of spurious and transient temperature readings reported by the sensors 112. For instance, a cooling profile may specify a moving average function for use in processing temperature measurements. Such moving average functions may be configured to provide different levels of smoothing that result in different types of responses to temperature changes. For instance, a longer moving average evaluates more past temperature measurements, resulting in greater smoothing and slower responses to changes in temperature. A shorter moving average calculation evaluates fewer samples and is thus more response to any detected changes, thus providing less smoothing.

As described in addition detail with regard to the below embodiments, cooling profiles may be predictively selected based on the context of a user's operation of IHS 100, such as the software applications that are in active use. For instance, based on detecting the initialization of a specific software application, the fan controller 114 may predictively configure the output of the cooling fans 106 to generate an airflow that is suitable for providing cooling during intervals when that specific application is in use. By predictively initiating airflow based on initialization of certain software applications, rapid temperature increases in core temperatures may be mitigated such that the highest, and loudest, fan speed settings are not reached. As described in additional detail below, in certain embodiments, the parameters specified by a cooling profile may be adapted to maintain sufficient cooling while reducing unnecessary airflow, and thus unnecessary noise generated by the airflow cooling system. In additional embodiments, cooling profiles may be further adapted in response to user inputs indicating noise preferences associated with the cooling system, such as indications of undesirable levels of noise being generated by the airflow cooling system.

As illustrated, IHS 100 embodiments may utilize an embedded controller 120 that may be a motherboard component of IHS 100 and may include one or more logic units. In certain embodiments, embedded controller 120 may operate from a separate power plane from the main processors 101 of IHS 100, and thus also separate from the operating system functions of IHS 100. Firmware instructions utilized by embedded controller 120 may be used to operate a secure execution environment that may include operations for providing various core functions of IHS 100, such as for power management, via a power adapter 124, and for certain remote management functions. In certain embodiments, the operations of the secure execution environment of embedded controller 120 may include operations describe herein for predictive selection and adaptation of workload profiles that are used to provide airflow cooling for IHS 100.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
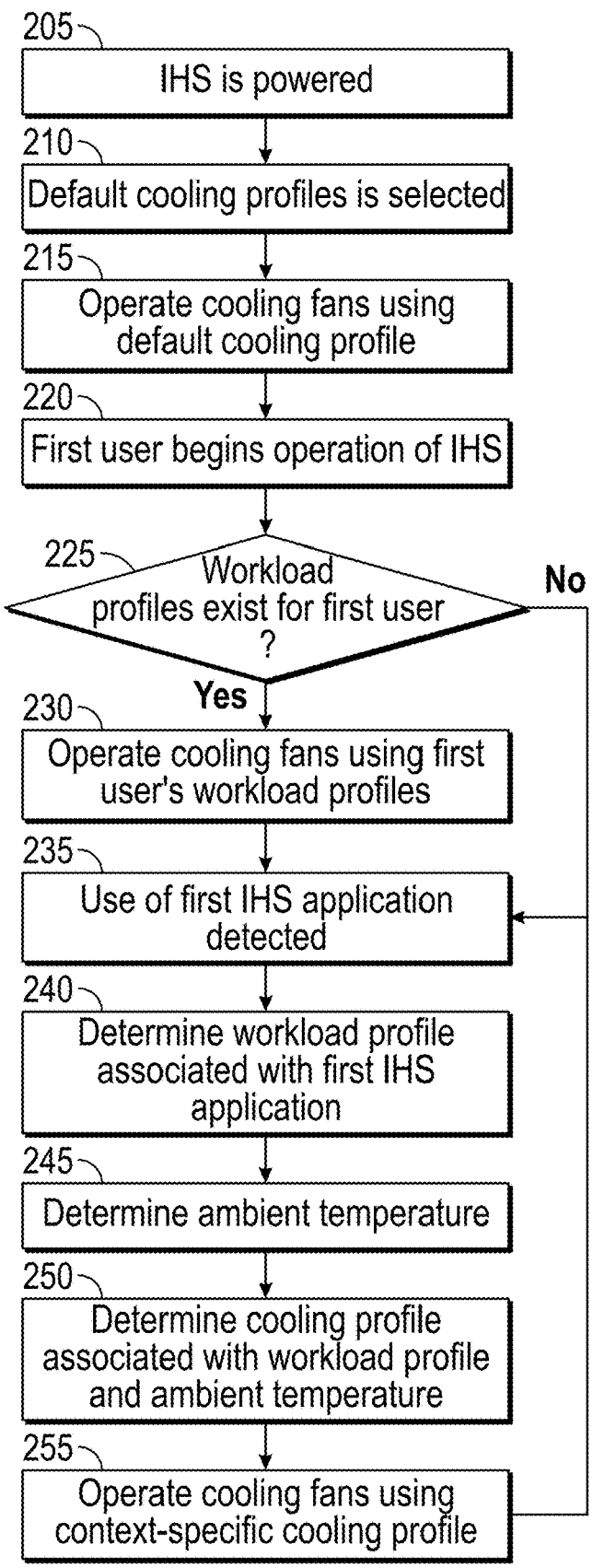
FIG. 2 is a flow chart illustrating certain aspects of a process according to embodiments for predictive fan control based on the selection of context-specific workload profiles that are used to provide airflow cooling to an IHS.

FIG. 2 is a flow chart illustrating certain aspects of a process, according to some embodiments, for predictive fan control based on the selection of context-specific workload profiles that are used to provide airflow cooling to an IHS. The process of FIG. 2 describes certain operations of a cooling system of an IHS, such as IHS 100 of FIG. 1. The illustrated embodiment begins at step 205 with the IHS being powered during routine use. In some embodiments, the IHS being powered may be a personal computing device such as a laptop computer or a desktop computer. In such scenarios, the IHS may be powered in response to a user input.

During initialization of the IHS, including during pre-boot procedures and during booting of the operating system of the IHS, a default cooling profile may be utilized to provide airflow cooling, at block 210. This default cooling profile may include a fan table and/or a set of fan curves specifying fan speeds to be utilized in order to provide cooling at various operating temperatures. The default cooling profile may also specify other default cooling fan parameters such as a default ramp rate and temperature smoothing function. The airflow outputs specific by the default cooling profile may be selected to provide sufficient airflow cooling during initialization of the IHS. At block 215, the cooling parameters specified by the default cooling profile are used by the IHS to operate the cooling fans and thus to provide airflow cooling to the internal components of the IHS. As described with regard to FIG. 1, certain IHSs may utilize a fan controller 114 to apply the parameters specified in a cooling profile in controlling the operation of the cooling fans of the IHS.

With the airflow cooling of the IHS being provided according to a default cooling profile, at block 220, a user begins operation of the IHS. In certain embodiments, at block 220, the user of the IHS is identified through an authentication process of the IHS that is configured to positively identify a user of the IHS prior to granting any use of the IHS. In certain embodiments, the identity of the user may be provided to the airflow cooling system, such as to the fan controller 114 of FIG. 1. Using such identity information, at block 225, the airflow cooling system may determine whether a set of workload profiles is associated with that user. In embodiments such as in FIG. 1, a fan controller 114 that provides airflow cooling within an IHS may maintain a set of workload profiles for one or more users of the IHS, where each workload profile is associated with a type of airflow cooling demand and is also associated with a cooling profile that provides parameters for fan control outputs that meet the particular airflow demand.

In certain embodiments, cooling profiles may be modified in order to account for specific preferences and utilization patterns of an individual user. As described in additional detail below, cooling profiles associated with a particular user may include fan control information that has been adapted in response to user inputs indicating preferences such as unacceptable noise levels and scenarios during which any noise level is acceptable. Also described in additional detail below, in certain embodiments, a workload profile for a particular user may also be adapted in order to reduce the noise output of the cooling system when generating airflow during use of applications associated with that workload profile. If a set of workload profiles associated with the user is identified, at block 230, these workload profiles are used to operate the cooling fans. If no workload profiles are associated with the user, the default cooling profile may remain in use.

During operation of the IHS, the user may initialize and operate any of the software application supported by the operating system of the IHS, including applications integral to the operating system and third-party applications installed by the user. At block 235, initialization and/or operation of a software application by the user is detected. In certain embodiments, an airflow cooling process running within the operating system of the IHS may be configured to detect the initialization of software applications by the user and to monitor software applications that are actively in use by the user. At block 240, a workload profile associated with the detected software application may be determined. In some embodiments, the airflow cooling process may report the use of software applications to the cooling system, such as to the fan controller, which determines the user's workload profile that is associated with the software application. In other embodiments, the airflow cooling process running in the operating system may maintain workload profiles for the user and may determine a workload profile associated with the software application that has been detected as being in active use.

In certain embodiments, a workload profile associates a cooling profile with one or more software applications that are supported by the IHS. In this manner, workload profiles may be used to specify groups of software applications with similar cooling requirements. In one embodiment, a workload profile may be associated with software applications that result in high processor loads and consequently have cooling needs that require persistent operation of the cooling fans. For instance, a three-dimensional modeling software application may be predominantly used in operations that generate intensive processor loads that require persistent and elevated airflow cooling outputs. Another workload profile may be associated with applications that have dynamic cooling requirements that are characterized by spikes in activity separated by periods of low activity. For instance, use of a web browser is typically associated with periods of resource-intensive activity separated by periods of inactivity. Another workload profile may be associated with applications that have balanced cooling requirements that remain relatively constant. For instance, a gaming application or a multimedia viewer may be associated with relatively constant levels of activity, thus resulting in relatively constant cooling demands. Based on the software initialization and activity information reported by the operating system airflow cooling process, a workload profile associated with an active software application may be determined. As described in additional detail, workload profiles may additional or alternatively specify groups of software applications that are associated with similar cooling preferences, such as preferences specified via noise feedback inputs provided by the user.

In the illustrated embodiment, at block 245, the temperature of the ambient air drawn by the airflow cooling system is determined. As described with regard to FIG. 1, a fan controller 114 may retrieve temperature information from one or more sensors 112 coupled to the IHS. Based on temperature information collected from such sensors and/or temperature information reported by other components of the IHS, the ambient temperature is determined and used to select an appropriate cooling profile, or to select an appropriate fan curve, such as a curve illustrated in FIG. 5B, or fan speed table from a cooling profile. Generally, providing airflow cooling at higher ambient temperatures requires operating cooling fans at higher speeds in order to generate higher airflow velocities capable of ventilating heat from within the IHS.

At block 250, a cooling profile associated with the workload profile of the active software application is determined. In some embodiments, a fan curve or fan speed table may also be selected from a cooling profile based on the determined ambient temperature. As illustrated in FIG. 5B, a cooling profile may include multiple fan curves that specify different fan speeds to be utilized for different ambient temperature ranges. Other cooling profile embodiments may similarly include different fan speed tables for use in different ambient temperate ranges. In this manner, airflow cooling may be adapted for specific contexts that may be defined through use of specific software applications and further defined based on ambient temperature readings. At block 255, the context-specific cooling profile is used to operate the cooling fans.

As indicated in FIG. 2, fans may be operated using parameters provided within a cooling profile until a switch in context is detected, such as the use of a different software application by the user. If the user switches to use of a different software application, the workload profile associated with this active software application is determined and a suitable cooling profile associated with this workload profile is also determined. The new cooling profile is used to adapt the output of the airflow cooling system to provide cooling within this new context. For instance, in one illustrative scenario, a user may operate a web-browser application while cooling is being provided according to parameters of a dynamic workload profile that includes a high ramp rate and includes settings for using high and low fan speeds in response to changes in parameters such as core temperatures, processing loads and/or power consumption. Upon switching to use of a multimedia viewing application that is associated with a balanced workload profile, the cooling system switches to use of a cooling profile associated with the balanced workload profile, where this cooling profile uses a lower ramp rate and features a range of mid-level fan speeds and a relatively low maximum fan speed. In various embodiments, context determinations may be based on all of the user applications that are currently running, the software applications that appear to be in active use by the user and/or a single application that is currently the main focus of the user's actions.

By configuring the output of the cooling system based on the software application selected for use, the cooling system predictively adjust the airflow output based on the cooling demands that can be expected to result from the use of that software application. Rather than waiting for use of an application to result in a processor load that generates enough heat to trigger a request for cooling, embodiments predictively configure the airflow cooling system for operation based on selection of an application for use by the user. Embodiments thus anticipate cooling needs based on use of a software application and may begin providing airflow according to the workload profile with which the application is associated. In this manner, adequate cooling may be provided while reducing unnecessary noise generated by worst-case configuration of the cooling system. For instance, for use of software applications associated with a balanced workload profile, a cooling profile may be utilized that specifies a relatively slow ramp rate since significant spikes in cooling demands are not expected for software applications associated with a balanced workload profile. Such use of workload profiles reduces unnecessary use of high fan speeds and rapid fan speed accelerations, thus reducing unnecessary noise.

Figure 3:
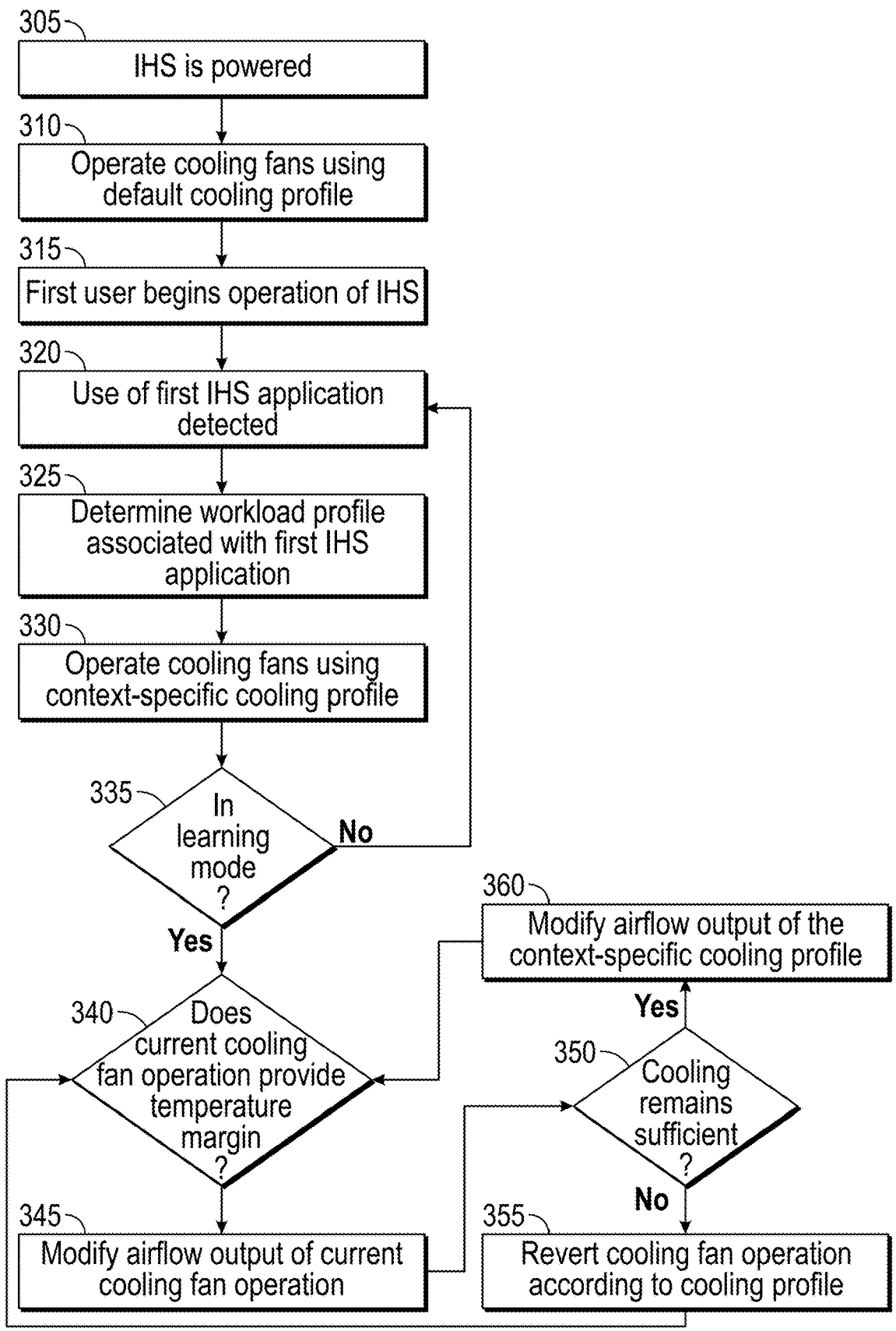
FIG. 3 is a flow chart illustrating certain aspects of an additional process according to embodiments for predictive fan control based on the selection and adaptation of context-specific workload profiles that are used to provide airflow cooling to an IHS.

FIG. 3 is a flow chart illustrating certain aspects of an additional process according to embodiments predictive fan control based on the selection and adaptation of context-specific workload profiles that are used to provide airflow cooling to an IHS. In the embodiment of FIG. 3, the workload profiles and associated cooling profiles may be adapted in order to reduce any excess airflow cooling output, and thus reduce unnecessary noise from the airflow cooling system. As in FIG. 2, the embodiment of FIG. 3 may begin with the powering of an IHS, at block 305, and operation of the cooling fans according to a default cooling profile, at block 310, during initialization of the IHS and during initial use of the IHS by a user. Also as in FIG. 2, at block 320, the use of a software application by the user is detected and, at block 325, a context-specific workload profile associated with the active application is determined. The context-specific workload profile is then used at block 330 to operate the cooling fans in anticipation of the airflow cooling required by applications that are associated with that workload profile. As described, in some embodiments, software applications may be associated with workload profiles that provide cooling for applications with persistent, dynamic or balanced airflow requirements. For instance, a particular gaming application may be associated with dynamic airflow requirements due to the game including long duration of play requiring a low-level of processing resources, but also including occasional spikes in activity, such as for rendering a new gaming environment.

With the airflow cooling system operating according to the workload profile associated with the active application, at block 335, the airflow cooling system determines whether a learning mode has been enabled. In certain learning mode embodiments, the airflow cooling system may seek to adjust the airflow output of a cooling profile and to thus adjust the noise associated with different workload profiles. For instance, the airflow cooling system may reduce the output of the cooling fans during operation of a graphics application associated with a workload profile for applications with a persistent airflow cooling demand. If this reduced airflow output continues to provide sufficient cooling, the airflow parameters of the cooling profile may be modified and future use of this application, and other applications associated with this workload profile, will be provided cooling according to this modified cooling profile.

As described, in many scenarios cooling systems are configured to operate in order to provide cooling for worst case scenarios. This results in cooling fans frequently being operated at higher speeds than are actually needed and frequently being operated using high ramp rates that result in noticeable noise. Accordingly, cooling systems frequently operate with a significant cooling margin that provides more airflow that is actually required. At block 340, the cooling system determines whether a temperature margin is present based on measured temperatures within the IHS and temperature thresholds, such as a Thermal Design Point (TDP), that specify upper limits on temperatures within the IHS. In embodiments such as the IHS of FIG. 1, a fan controller may obtain component temperature information, such as core temperatures, from sensors supported by the IHS. Based on the upper thresholds for these component temperatures, the cooling system may determine whether a temperature margin is present. If no significant temperature margin is present, no excess airflow output is present, and no airflow output modifications are attempted. However, further attempts may be made upon continued use or upon switching of cooling profiles based on changes in context resulting from changes in the ambient temperature or from the user switching to use of a different application.

If a non-negligible temperature margin is present between the measured temperatures and the upper thresholds, at block 345, the cooling system reduces the output of the cooling fans, thus reducing the noise generated by system and power consumed by the cooling system. In some embodiments, the reductions in cooling fan output may be specified as percentages, such as reducing fan speeds by five percent. In some embodiments, the reductions in cooling fan outputs may be proportional to the size of the temperature margin identified at block 340. In some embodiments, other cooling parameters besides fan speed may be similarly modified. For instance, a ramp rate may be adjusted by reducing the maximum fan acceleration that may be utilized, thus providing better opportunity for increasing fan speeds to remain unnoticed by the user. In another example, a temperature smoothing function may be modified to provide greater smoothing of temperature readings, thus reducing rapid changes in fan speed outputs that may be noticeable to users.

With the cooling fans operating based on such modified airflow outputs, at block 350, the cooling system determines this reduced airflow output remains sufficient for meeting the cooling requirements of the IHS. In certain embodiments, determining whether a reduced airflow output provides sufficient cooling may include evaluating temperature readings for a time duration long enough to ensure the stability of the temperatures at the reduced airflow output. If temperature readings indicate that the reduced airflow output is insufficient, at block 355, the modified airflow parameters are reverted. As indicated in FIG. 3, additional attempts to adjust airflow parameters may be attempted if a temperature margin remains. For instance, in certain embodiments, machine learning techniques may be utilized to alter the magnitudes of the adjustments as well as altering the airflow parameters that are adjusted. The feedback provided at step 350 may be utilized by such machine learning techniques in adapting the airflow modifications that are attempted at step 345.

If the reduced airflow output is determined to provide sufficient cooling, at block 360, modifications may be made to the cooling profile associated with the workload profile that is currently in use. For instance, in one scenario, a user may initiate use of a software application associated with a persistent workload profile, such as a graphics editing application. As part of learning mode operations, a five percent reduction in fan speeds may be implemented and determined to provide sufficient cooling during use of this particular application. Accordingly, at block 360, the cooling profile associated with the persistent workload profile may be adjusted to reflect the five percent reduction in fan speed that is currently in use. Future use of this graphics application, or other persistent workload applications, will utilize this reduced airflow output. In this manner, the output of the airflow cooling system may be reduced, thus reducing the noise output of the cooling system, while still providing sufficient cooling to the internal components of the IHS.

In some embodiments, the learning mode of FIG. 3 may also include modifying the workload profile that a software application is associated with. For instance, as described above, a particular gaming application may include occasional spikes of high-processor loads separated by durations of low-processor loads. However, initial classification of this gaming application may result in the application being associated with a balanced workload profile in scenarios where gaming applications typically exhibit relatively constant airflow cooling requirements. Accordingly, in some embodiments, at block 345, the airflow cooling system may modify the workload profile associated with gaming application. In certain embodiments, such workload profile modifications may be made using machine learning techniques that determine an appropriate workload profile for providing cooling during use of a software application based on statistical evaluations of processor loads during use of the application. Such evaluations of processor loads during use of an application may be used to characterize the cooling requirements of the application as being persistent, dynamic or balanced.

In evaluating the suitability of such modifications to the workload profile associated with a software application, the cooling system may first require that cooling remain sufficient while using the new workload profile. In addition, when choosing between cooling profiles that both provide sufficient cooling during use of a particular software application, the cooling system may be configured to choose the cooling profile that supports quieter operation of the IHS. In this manner, the workload profiles and cooling profiles associated with a software application may be adapted for quieter operation of an IHS.

Figure 4:
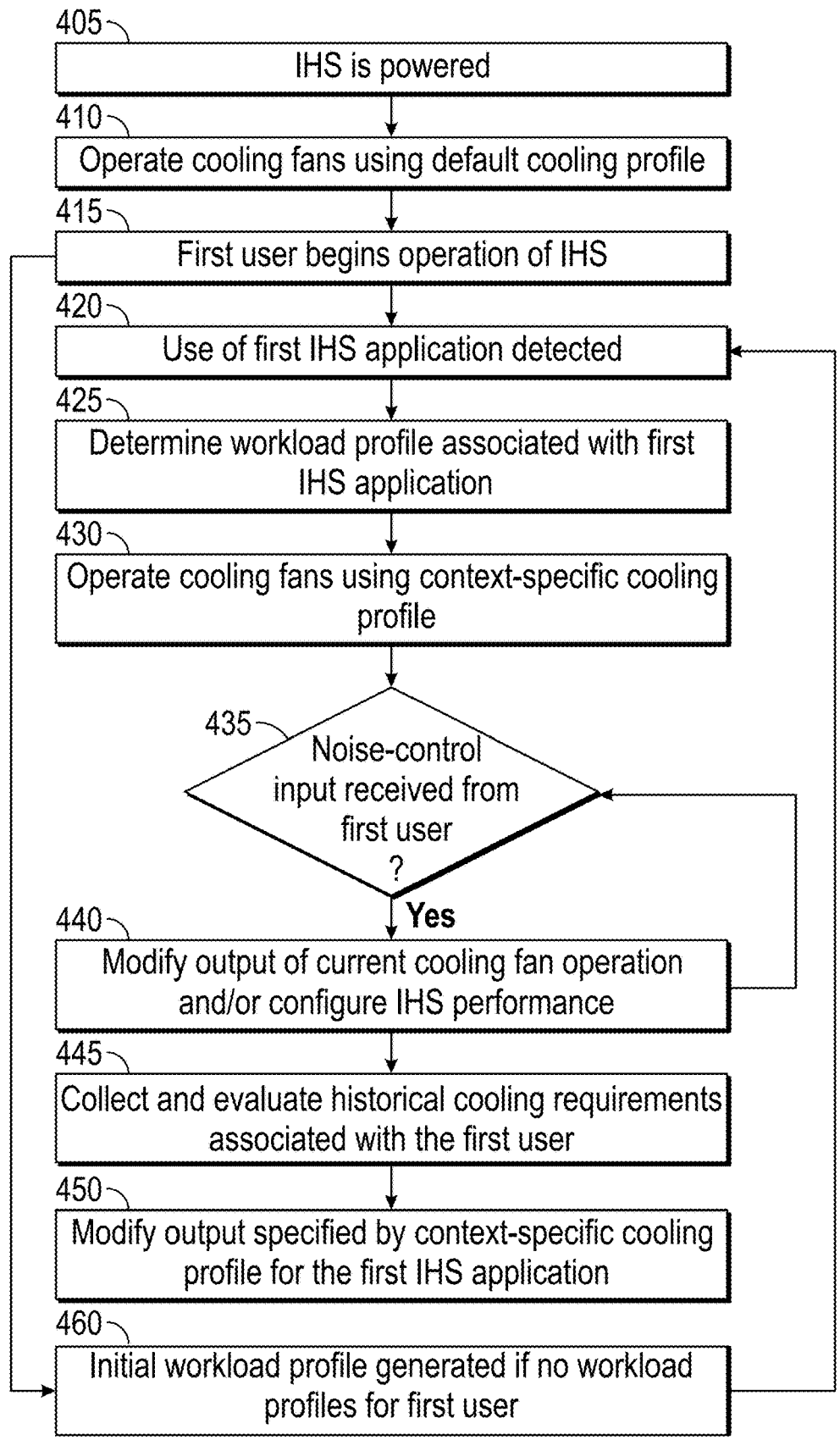
FIG. 4 is a flow chart illustrating certain aspects of an additional process according to embodiments for adaptive fan control based on user-provided noise preferences for cooling provided using workload profiles.

FIG. 4 is a flow chart illustrating certain aspects of an additional process according to embodiments for adapting and generating fan control using workload profiles based on user-provided noise preferences and historical monitoring of user behavior. In FIG. 4, the workload profiles and associated cooling profiles may be generated and adapted based on user inputs indicating undesirable levels of noise from the cooling system and/or user inputs indicating a preference for performance without regard to noise generated by the cooling system. In addition, workload profiles and associated cooling profiles may be generated and adapted based on monitored user behavior indicating particularized cooling requirements for different users. As in FIGS. 2 and 3, the embodiment of FIG. 4 may begin with the powering of an IHS, at block 405, and operation of the cooling fans according to a default cooling profile, at block 410, during initialization of the IHS and during initial use of the IHS by a user.

At block 415, the user that is operating the IHS is identified and, in some embodiments, a set of workload profiles associated with that particular user is identified and utilized in controlling the operation of the cooling system. In certain instances, no workload profile may be known for a particular user, such as for a new user. As described above, airflow cooling may be provided according to default cooling parameters in situations where a user-specific workload profile is not available. In such scenarios, at block 460, an initial workload profile may be generated for the unrecognized user. As described below, both monitoring of user behavior and user inputs may be used as learning inputs used in populating this initial workload profile.

Whether providing cooling using workload profiles associated with a particular user or using default cooling parameters, at block 420, active use of a software application by the user is detected. In scenarios where one or more application-specific workload profiles for a particular user are available, at block 425, a workload profile associated with the active application is determined, thus providing a selection of a workload profile based on the context of the application that is in use. Such a context-specific workload profile is then used at block 430 to operate the cooling fans according to the parameters of the cooling profile associated with that workload profile. As described, some cooling profiles may include multiple fan curves, each suitable for operation of the cooling fans within a range of ambient air temperatures. For instance, FIG. 5B illustrates three fan control curves 525, 530, 535, where each of the control curves is for use at different ambient temperatures, and thus a different environmental context. In such instances, the cooling parameters, such as the fan control curves 525, 530, 535, that are utilized at block 430 may be selected from the cooling profile based on this ambient temperature context in which the cooling system is operating.

With the airflow cooling system operating according to the workload profile associated with the current operating context, at block 435, the airflow cooling system may receive noise control inputs from the user. As described above, certain embodiments of the described cooling system may operate using an airflow cooling process that runs within the operating system of the IHS. In some embodiments, this airflow cooling OS process may include a capability by which users may provide inputs regarding noise levels generated by the airflow cooling system. For instance, a user may be provided with a graphic interface, button inputs, key commands, menu options or other operating system mechanisms for providing noise related inputs to the cooling system.

Using such inputs, a user may provide an indication that the current noise output of the cooling system is undesirable. In certain instances, the user may indicate a noise preference that is applicable for use of a specific software application. In other instances, the user may indicate a general noise preference that pertains to all software that may be run by an IHS. For example, during use of a multimedia viewing application, the user may provide an input indicating a preference for low levels of noise during use of this particular application. Such a user may prefer that noise levels generated by the cooling system remain non-obtrusive during use of this multimedia application, or at least during use of this multimedia application during specific contexts such as during specific times of day or at specific locations. In other scenarios, the user may provide noise related inputs that indicate a preference for maximum performance during use of certain software applications without regard to noise generated by the cooling system. For instance, during use of a gaming application, a user may provide an input indicating a preference for use of all available cooling resources in order to support maximum IHS performance regardless of the noise generated by the cooling system.

Upon receipt of such user inputs, at block 440, the cooling system may respond by reducing the airflow output in a manner that reduces noise. The cooling system may also respond by throttling performance characteristics of the IHS such that less heat is generated, and less cooling is required. As described with regard to the cooling profile modifications of FIG. 3, the output of the cooling profile may be modified by reducing one or more fan speeds associated with the cooling profile or reducing other airflow parameters of the cooling profile such as the ramp rate. In certain instances, these reductions in airflow output may necessitate throttling performance aspects of the IHS, such as limiting the processor load or power consumption of the IHS. However, as described above, in certain instances, an airflow cooling system may operate within a temperature margin that allows the airflow output to be reduced while still providing adequate cooling. Accordingly, in such instances, the airflow output may be reduced in response to a user input without any corresponding performance throttling. In instances where the user input specifies a preference for performance without regard to noise, the cooling system responds by increasing the airflow in a manner that supports maximum IHS performance.

In certain embodiments, cooling requirements characteristics may be monitored during a user's operation of an IHS and used in adapting a set of workload profiles that are particularized for the user. Such monitoring information may be collected and evaluated at block 455. For instance, embodiments may monitor the duration of distinct periods of airflow cooling requirements for a particular user. In one scenario, a first user may operate a computationally demanding modeling application for long periods of time, while a second user may typically operate that same location for much shorter periods of time. In such a scenario, a workflow profile selection or an adaptation to an existing workflow profile may be based on such duration information. The first user's workload profile may be selected and/or adapted to account for greater cooling requirements than the second user. In some scenarios, these distinct periods are not be associated with the use of specific applications. For instance, monitoring of cooling requirements for a particular user may indicate prolonged periods of high cooling demands for a user without regard to the software applications that are in use. In certain embodiments, such historical cooling information may be utilized in selecting and adapting the workload profiles associated with a particular user.

In a similar manner to the embodiment of FIG. 3, at block 450, the modifications made at block 440 in response to a user input and the historical information collected at block 455 may be incorporated into workload profiles associated with the user or may be used in selecting workload profiles for a new user. The cooling profile that is currently in use by the cooling system may be modified to reflect the cooling and performance adjustments made at block 440 or to modify the workload and/or cooling profiles associated with a user based on the historical information collected at block 455 and the manual user inputs provided at block 435. For example, during use of a gaming application that is associated with a dynamic workload profile, a user may specify that performance of the gaming application is preferred without regard to noise caused by the cooling system. In such a scenario, the cooling profile associated with the dynamic workload profile may be adjusted, at block 450, to support additional cooling. For instance, a higher ramp rate may be used to support faster responses to spikes in processing demand and faster fan speeds may be used to provide a temperature margin allowing for maximum processor performance during these computational spikes. In another example, use of computationally demanding modeling application by a particular user may be initially be for relatively short durations, but over time, historical information may indicate the durations of use are increasing. Accordingly, the workload profile associate with the modeling application may be modified, or cooling profile parameters of the workload profile may be adjusted in order to increase the cooling provided during use of the modeling application by that user. As with the embodiment of FIG. 3, machine learning techniques may utilize the specific user inputs provided at block 435 and the historical information collected at block 455 in selecting the modifications made at block 440.

In certain embodiments, an additional user input may be supported that allows a user to reset the particularized operation of the cooling system described herein. For instance, the airflow cooling process running within the operating system may provide a user input for resetting the workload profiles and cooling profiles that are in use, such as in response to modifications to the IHS. For instance, the thermal output characteristic may change significantly due to the addition of a new internal component, such as additional memory or an expansion card being plugged into the motherboard of the IHS. In such instances, the reset indicator provided by the user signals the cooling system to revert to the use of default cooling profiles with the selection and adaptation of particular profiles conducted according to the embodiments described herein.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for providing airflow cooling in an IHS (Information Handling System), the method comprising:
   generating a default airflow cooling output during initialization of the IHS;

detecting active use of a first software application by a first user of the IHS;

determining a first workload profile associated with the first software application, wherein the first workload profile comprises a first cooling profile specifying parameters for providing cooling during use of software applications associated with a first type of resource utilization;

generating a first airflow cooling output based on the first cooling profile;

detecting the first user of the IHS switching from active use of the first software application to active use of a second software application;

in response the detection of the user switching from use of the first application to the second software application, determining a second workload profile associated with the second software application, wherein the second workload profile comprises a second cooling profile specifying parameters for providing cooling during use of software applications associated with a second type of resource utilization;

generating a second airflow cooling output based on the second cooling profile; and receiving an input from the first user during use of the second software application, wherein the input reports undesirable levels of noise during generation of the second airflow cooling output used to provide cooling during active use of the second software application, wherein the undesirable levels of noise reported by the first user during use of the second software application are utilized by machine learning to adapt the parameters of the first cooling profile used to reduce unnecessary airflow cooling during active use of the second software application.

2. The method of claim 1, wherein the first cooling profile and the second cooling profile comprise fan speed settings adapted based on operation of the first IHS by the first user.

3. The method of claim 2, wherein the first cooling profile and the second cooling profile further comprise a fan speed ramp rate setting, wherein a high fan speed ramp rate increases fans speeds at a faster rate and generates more noise than a low fan speed ramp rate.

4. The method of claim 2, wherein the first cooling profile further comprises a function for smoothing temperatures measured within the IHS, and wherein the smoothing function is selected to reduce noise generated during operation of the first cooling profile.

5. The method of claim 1, further comprising:
determining a thermal design point of a processor of the IHS; and
when a temperature measured at the processor is not below the thermal design point of the processor by a first temperature margin, forgo use of the first workload profile and of the second workload profile.

6. The method of claim 5, further comprising
monitoring a plurality of temperatures within the IHS during use of the reduced airflow cooling; and
determining whether the reduced airflow cooling output provides sufficient cooling based on the monitored temperatures.

7. The method of claim 6, further comprising:
when the reduced airflow provides sufficient cooling, modifying a plurality of the parameters of the second cooling profile to generate the reduced airflow during operation of additional software applications associated with the second workload profile.

8. The method of claim 1, further comprising:
detecting a user input specifying a reset of the airflow cooling of the IHS, wherein the IHS reverts to use of the default airflow cooling output after detecting the user reset of the airflow cooling of the IHS.

9. An IHS (Information Handling System) comprising:
a plurality of processors;
a plurality of cooling fans for providing airflow cooling;
an airflow controller comprising a memory device having instructions stored thereon that, upon execution by a logic unit, cause the airflow controller to:
operate the plurality of cooling fans in generating a default airflow cooling output during initialization of the IHS;
receive an indication of active use of a first software application by a first user of the IHS;
determine a first workload profile associated with the first software application, wherein the first workload profile comprises a first cooling profile specifying parameters for providing cooling during use of software applications associated with a first type of resource utilization;
operate the plurality of cooling fans in generating a first airflow cooling output based on the first cooling profile;
detecting the first user of the IHS switching from active use of the first software application to active use of a second software application;
in response the detection of the user switching from use of the first application to the second software application, determine a second workload profile associated with the second software application, wherein the second workload profile comprises a second cooling profile specifying parameters for providing cooling during use of software applications associated with a second type of resource utilization;
operate the plurality of cooling fans in generating a second airflow cooling output based on the second cooling profile; and
receive an input from the first user during use of the second software application, wherein the input reports undesirable levels of noise during generation of the second airflow cooling output used to provide cooling during active use of the second software application, wherein the undesirable levels of noise reported by the first user during use of the second software application are utilized by machine learning to adapt the parameters of the first cooling profile used to reduce unnecessary airflow cooling during active use of the second software application.

10. The IHS of claim 9, wherein the memory device of the airflow controller stores additional instructions that, upon execution by the logic unit, further cause the airflow controller to:
determine a thermal design point of a processor of the IHS; and
when a temperature measured at the processor is not below the thermal design point of the processor by a first temperature margin, forgo use of the first workload profile and of the second workload profile.

11. The IHS of claim 10, wherein the memory device of the airflow controller stores additional instructions that, upon execution by the logic unit, further cause the airflow controller to:
modify, when the reduced airflow provides sufficient cooling, a plurality of the parameters of the second cooling profile to generate the reduced airflow during operation of additional software applications associated with the second workload profile.

12. The IHS of claim 9, wherein the memory device of the airflow controller stores additional instructions that, upon execution by the logic unit, further cause the airflow controller to:
receive a second input from the first user during use of the second software application, wherein the second input specifies a noise preference, wherein the noise preference specifies a limit on the noise generated in providing cooling during use of the second software application.

13. The IHS of claim 9, wherein the memory device of the airflow controller stores additional instructions that, upon execution by the logic unit, further cause the airflow controller to:
detect a user input specifying a reset of the airflow cooling of the IHS, wherein the IHS reverts to use of the default airflow cooling output after detecting the user reset of the airflow cooling of the IHS.

14. A non-transitory computer-readable storage device having instructions stored thereon for providing airflow cooling in an IHS (Information Handling System) via a plurality of cooling fans, wherein execution of the instructions by the one or more processors, cause the one or more processors to:
operate the plurality of cooling fans in generating a default airflow cooling output during initialization of the IHS;
receive an indication of active use of a first software application by a first user of the IHS;
determine a first workload profile associated with the first software application, wherein the first workload profile comprises a first cooling profile specifying parameters for providing cooling during use of software applications associated with a first type of resource utilization;
operate the plurality of cooling fans in generating a first airflow cooling output based on the first cooling profile;
detect the first user of the IHS switching from active use of the first software application to active use of a second software application;
in response the detection of the user switching from use of the first application to the second software application, determine a second workload profile associated with the second software application, wherein the second workload profile comprises a second cooling profile specifying parameters for providing cooling during use of software applications associated with a second type of resource utilization; and
operate the plurality of cooling fans in generating a second airflow cooling output based on the second cooling profile; and
receive an input from the first user during use of the second software application, wherein the input reports undesirable levels of noise during generation of the second airflow cooling output used to provide cooling during active use of the second software application, wherein the undesirable levels of noise reported by the first user during use of the second software application are utilized by machine learning to adapt the parameters of the first cooling profile used to reduce unnecessary airflow cooling during active use of the second software application.

15. The computer-readable storage device of claim 14, wherein the instructions further cause the one or more processors to:
determine a thermal design point of a processor of the IHS; and
when a temperature measured at the processor is not below the thermal design point of the processor by a first temperature margin, forgo use of the first workload profile and of the second workload profile.

16. The computer-readable storage device of claim 15, wherein the instructions further cause the one or more processors to:
modify, when the reduced airflow provides sufficient cooling, a plurality of the parameters of the second cooling profile to generate the reduced airflow during operation of additional software applications associated with the second workload profile.

17. The computer-readable storage device of claim 14, wherein the instructions further cause the one or more processors to:
receive a second input from the first user during use of the second software application, wherein the second input specifies a noise preference, wherein the noise preference specifies a limit on the noise generated in providing cooling during use of the second software application.

18. The computer-readable storage device of claim 14, wherein the instructions further cause the one or more processors to:
detect a user input specifying a reset of the airflow cooling of the IHS, wherein the IHS reverts to use of the default airflow cooling output after detecting the user reset of the airflow cooling of the IHS.

* * * * *